United States Patent [19]

Parker

[11] Patent Number: 5,637,951
[45] Date of Patent: Jun. 10, 1997

[54] ELECTRON SOURCE FOR MULTIBEAM ELECTRON LITHOGRAPHY SYSTEM

[75] Inventor: N. William Parker, Menlo Park, Calif.

[73] Assignee: Ion Diagnostics, Inc., Menlo Park, Calif.

[21] Appl. No.: 513,261

[22] Filed: Aug. 10, 1995

[51] Int. Cl.⁶ ............................................. H01J 1/30
[52] U.S. Cl. .................... 313/336; 313/309; 315/169.1
[58] Field of Search ...................... 315/366, 169.1, 315/169.4; 313/336, 351, 309, 422, 497

[56] References Cited

U.S. PATENT DOCUMENTS

| | | | |
|---|---|---|---|
| 4,675,572 | 6/1987 | Watanabe et al. | 313/497 |
| 4,940,916 | 7/1990 | Borel et al. | 313/306 |
| 4,990,766 | 2/1991 | Simms et al. | 313/336 |
| 5,103,144 | 4/1992 | Dunham | 315/366 |
| 5,363,021 | 11/1994 | MacDonald | 315/366 |
| 5,528,103 | 6/1996 | Spindt et al. | 313/497 |

Primary Examiner—Michael Horabik
Assistant Examiner—Michael Day
Attorney, Agent, or Firm—Eugene A. Parsons

[57] ABSTRACT

An electron source including a non-orthogonal row-column matrix of two dimensional arrays of electron emitters positioned in groups of arrays, common control electrodes mounted adjacent associated groups, and electrical connections to the arrays in each group connecting the emitters in each array in parallel and connecting each array in each group to a similar array in each other group so as to form rows of groups equal in number to the number of arrays in each group. The groups are positioned along a first axial direction and arranged with the arrays in each group spaced apart in a second direction, at an angle to the first direction, so that the arrays are evenly spaced in the first direction. In one embodiment dummy control electrodes are used at each end of the structure and in another embodiment a field compensating electrode is provided on opposite sides of each control electrode and a surrounding electrode extends between adjacent field compensating electrodes.

34 Claims, 15 Drawing Sheets

ELECTRON SOURCE FOR MULTIBEAM ELECTRON LITHOGRAPHY SYSTEM

FIELD OF THE INVENTION

The present invention pertains to electron sources and more specifically to an electron source suitable for use in a multibeam electron lithography system.

BACKGROUND OF THE INVENTION

One of the major uses of lithographic systems is in the semiconductor art for manufacturing integrated circuits and the like. Generally, complete semiconductor wafers are processed by forming a large number of similar integrated circuits (semiconductor chips) on the wafer and then cutting the wafer into individual chips. Integrated circuits can be patterned on the wafer in a variety of different ways including optical lithography, X-ray lithography, direct-write electron beam lithography, etc. Optical lithography utilizes masks and reticles which are limited in the minimum feature size that can be achieved and have the additional drawback that each subsequent mask or reticle in the set must be accurately registered with the preceding patterned layer. Also, mask generation, inspection and repair adds substantial cost and time delays, since each step must be done with separate and expensive machinery.

In lithography, the wafer is coated with a photosensitive emulsion and a beam of light (or other energetic particles) passes through the mask or reticle and then exposes the components, circuits, interconnecting lines, etc. in the photosensitive emulsion on the wafer. In the past, for example, it has been found that an X-ray beam can be used to expose lines less than one micron wide. The problem is that it takes a great amount of time to expose all of the features in a plurality of chips with a single X-ray beam. Further, as the size of the wafers increases from 100 mm diameter to as much as 300 mm diameter this problem becomes much greater.

Some multibeam electron lithography systems have been devised but these systems are limited in the size of the wafer which can be written, i.e., because of the means for generating the beam and the focusing utilized, the area that can be exposed simultaneously is limited. Generally only a single type of pattern can be written on the wafer because all of the beams are controlled simultaneously, although the single type of pattern can be written on a number of integrated circuits simultaneously. Also, in many instances it is necessary to provide a different system for each size of the wafer being processed. Further, because of the beam generating means and the focusing elements, the spot size and registration accuracy are limited so that the ultimate resolution is only marginally better than can be produced with other methods.

It would be highly advantageous to provide an electron source for multibeam electron lithography systems which is more controllable and has higher lithographic resolution.

Accordingly, it is an object of the present invention to provide a new and improved electron source with higher resolution than prior art electron sources.

It is yet another object of the present invention to provide a new and improved electron source which can conveniently be used in multibeam electron lithography systems to render these systems much more compliant and versatile.

It is yet another object of the present invention to provide a new and improved electron source which can be utilized on substantially any wafer size and which can be used in an electron beam lithography system to write a variety of different integrated circuit patterns on a single wafer, simultaneously.

It is a further object of the present invention to provide a new and improved electron source which eliminates the need for X-Y scanning deflectors.

It is a still further object of the present invention to provide a new and improved electron source which greatly reduces the current requirements for each individual electron emitter utilized.

SUMMARY OF THE INVENTION

The above problems and others are at least partially solved and the above objects are realized in an electron source including a non-orthogonal row-column matrix of two-dimensional arrays of field emitters, an array of control electrodes mounted adjacent associated column groups of field emitter arrays, and electrical connections connecting a single array from each column group in parallel with the corresponding single arrays in each other column group. The column groups are positioned along a row axis and arranged with the arrays in each group spaced apart along a column axis, at an angle to the row axis, so that the arrays are evenly spaced when projected into the row axis.

In one embodiment of the invention, a single emitter array from each column group may be activated simultaneously by supplying an activating potential to a selected one of the row axis electrical connections to the field emitter arrays and to one or more of the control electrodes simultaneously. To eliminate the electrostatic effects on the electron beams of adjacent control electrodes, a field compensating electrode is provided on opposite sides of each control electrode and a surrounding electrode extends between adjacent field compensating electrodes.

In a second embodiment of the invention, row-column addressing is performed such that all emitter arrays within a single column group may be activated simultaneously by supplying an activation potential to one of the control electrodes while simultaneously supplying activating potentials to one or more of the row-axis field emitter array addressing connections.

BRIEF DESCRIPTION OF THE DRAWINGS

Referring to the drawings.

DESCRIPTION OF THE PREFERRED EMBODIMENTS

Figure 1:
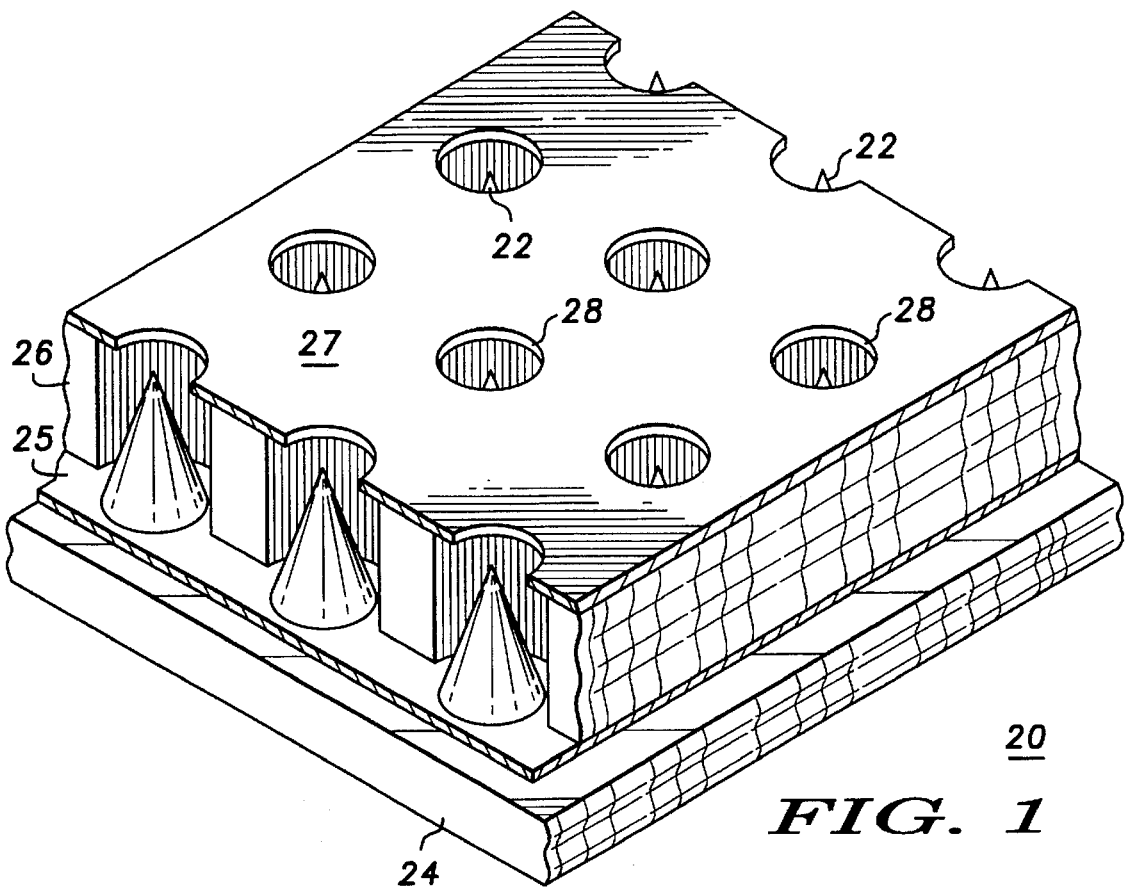
FIG. 1 is a greatly enlarged view in perspective, portions thereof broken away and shown in section, of a two dimensional array of electron emitters.

Referring specifically to FIG. 1, a two dimensional array 20 of electron emitters 22 is illustrated in a perspective view, with portions thereof broken away and shown in section for convenience of understanding. In this specific embodiment, array 20 is formed on an insulating substrate 24 that has a layer 25 of conducting material formed thereon, which layer 25 serves as the emitter base. An insulating layer 26 is formed on layer 25 and a second conducting layer 27 is formed on the surface of insulating layer 26. A plurality of spaced apart tubular openings 28 is formed through layers 27 and 26 so as to extend down to and expose the surface of conducting layer 25. An electron emitter 22 is formed on conducting layer 25 in each opening 28.

Generally, array 20, as described, can be fabricated by any convenient means, such as that described in U.S. Pat. No. 5,007,873, entitled "Non-Planar Field Emission Device Having an Emitter Formed With a Substantially Normal Vapor Deposition Process", issued Apr. 16, 1991 and included herein by reference. Also, while conical field emission tips generally referred to in the industry as "Spindt tips" are utilized in this specific embodiment, it should be understood that many other types of field emission devices and electron emitters, e.g. diamond and other low work function material type emitters, can be utilized, as will be understood from the following explanation.

As is understood in the field emission art, second conducting layer 27 serves as an extraction or control electrode for array 20. Generally, the tips of electron emitters 22 are located approximately in the plane of second conducting layer 27, with second conducting layer 27 spaced an equidistance from and peripherally surrounding each tip. Since all of electron emitters 22 are formed on and in contact with common conducting layer 25 and a single second conducting layer 27 forms a common control electrode for each electron emitter 22 in array 20, all electron emitters 22 in array 20 are connected in parallel and are activated or inactivated simultaneously.

When a suitable potential is applied between conducting layer 25 and second conducting layer 27, a very high electric field is created around each of the tips which causes each of the tips to emit electrons by field emission. Generally, since all of the electron emitters 22 in an array 20 cooperate to produce a single beam of electrons, an array is considered as a pixel. Also, since all of the electron emitters operate in parallel, the amount of current that must be produced by a single electron emitter 22 is substantially reduced (generally to below a microampere) and there is a certain amount of redundancy.

Generally, it has been found that adequate emission is produced when a potential is applied to conducting layer 27 (the control electrode) that is in a range of 40 volts to 100 volts more positive than electron emitters 22. Also, when electron emitters which are formed of low work function material, such as diamond, are utilized, this potential may drop to as low as 2 to 5 volts. Some specific potentials will be discussed below for convenience of explanation and throughout this discussion a potential on conducting layer 27 (the control electrode) that is 100 volts more positive than the potential on conduction layer 25 is assumed to ensure proper operation. In addition, for convenience of explanation, the bias potential on the electron emitters 22 is assumed to be −6000 volts when they are activated and −5900 volts when they are inactivated.

Figure 2:
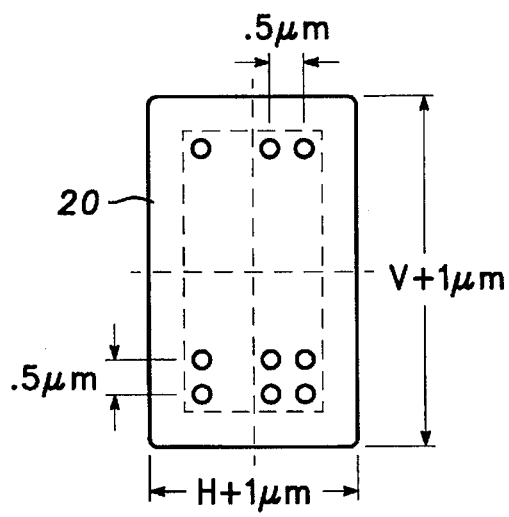
FIG. 2 is a greatly enlarged top plan view of a two dimensional array of electron emitters, similar to that illustrated in FIG. 1, illustrating some of the typical dimensions and numbers of components thereof.

A generic two dimensional electron emitter array 20 is illustrated in FIG. 2 so that sizes and relative positions of components can be conveniently understood. It will be understood by those skilled in the art that the specific sizes and dimensions disclosed in conjunction with FIG. 2 (and FIGS. 3–8) are for embodiments utilizing Spindt tip electron emitters and different sized and shaped arrays may be utilized for different types of electron emitters. Array 20 in FIG. 2 has N tips along each line in the horizontal direction and 2N tips along each line in the vertical direction. Also, the center-to-center spacing of adjacent tips in the horizontal and vertical directions is 0.5 μm with the dimension of the tip base (conducting layer 25) of array 20 being an additional 1.0 μm in both the vertical and horizontal directions.

Figure 3:
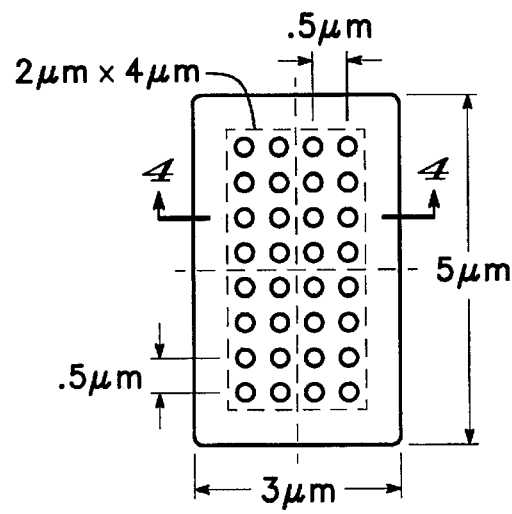
FIG. 3 is a top plan view similar to FIG. 2, illustrating a specific two dimensional array of electron emitters.
Figure 4:
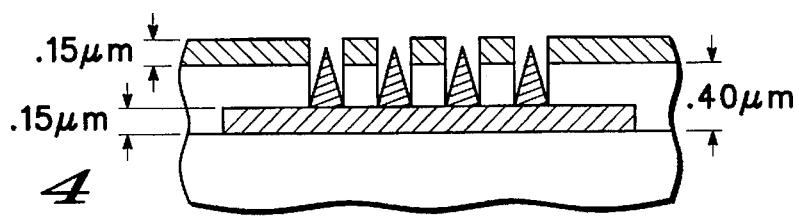
FIG. 4 is a sectional view as seen from the line 4—4 of FIG. 3.
Figure 5:
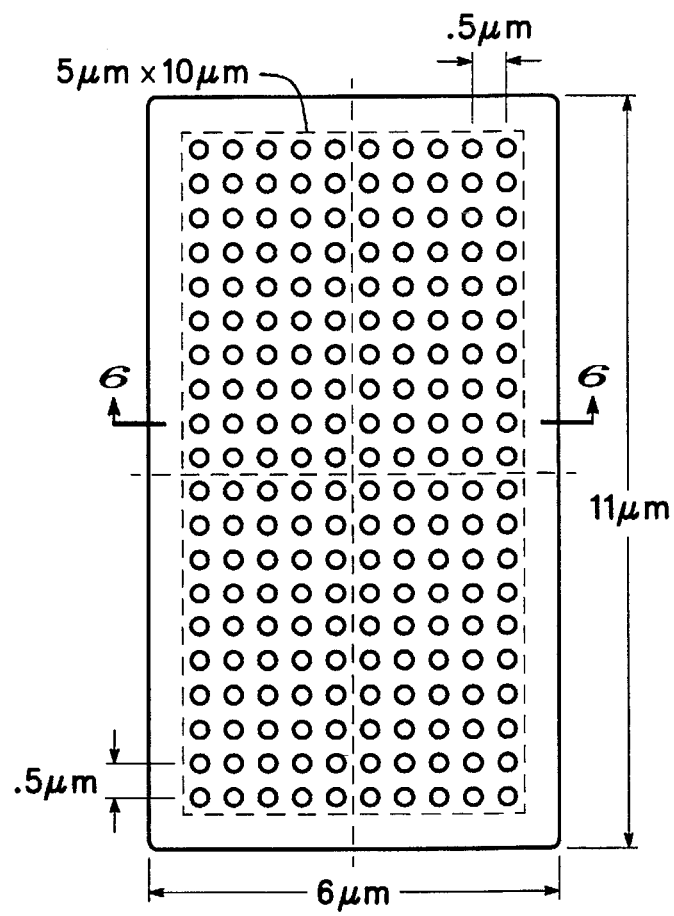
FIG. 5 is a top plan view similar to FIG. 2, illustrating another specific two dimensional array of electron emitters.
Figure 6:
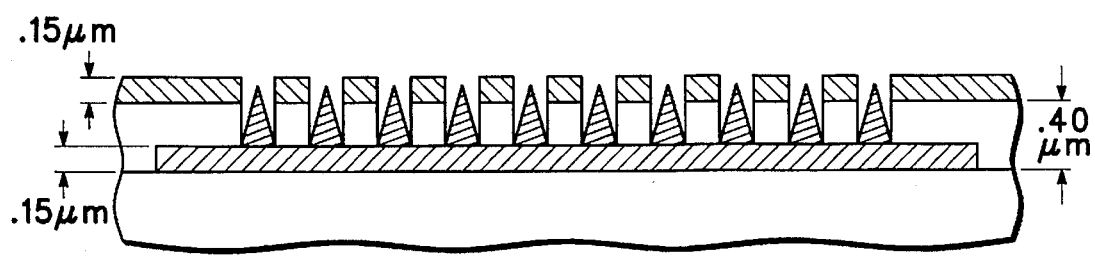
FIG. 6 is a sectional view as seen from the line 6—6 of FIG. 5.

Referring to FIGS. 3–6, two different specific examples of two dimensional electron emitter arrays are illustrated to better understand the generic model of array 20 illustrated in FIG. 2. A 4×8 tip array is illustrated in FIGS. 3 and 4 with a center-to-center spacing of adjacent tips in the horizontal and vertical directions of 0.5 μm, which results in an emitter base with a horizontal dimension of 3.0 μm and a vertical dimension of 5.0 μm. As can be seen most clearly in FIG. 4, the emitter base (conducting layer 25) is approximately 0.15 μm thick, insulating layer 26 is approximately 0.4 μm thick, and the control electrode (second conducting layer 27) is approximately 0.15 μm thick. A 10×20 tip array is illustrated in FIGS. 5 and 6 with a center-to-center spacing of adjacent tips in the horizontal and vertical directions of 0.5 μm, which results in an emitter base with a horizontal dimension of 6.0 μm and a vertical dimension of 11.0 μm. The thickness dimensions are substantially similar to those in FIG. 4.

Figure 7:
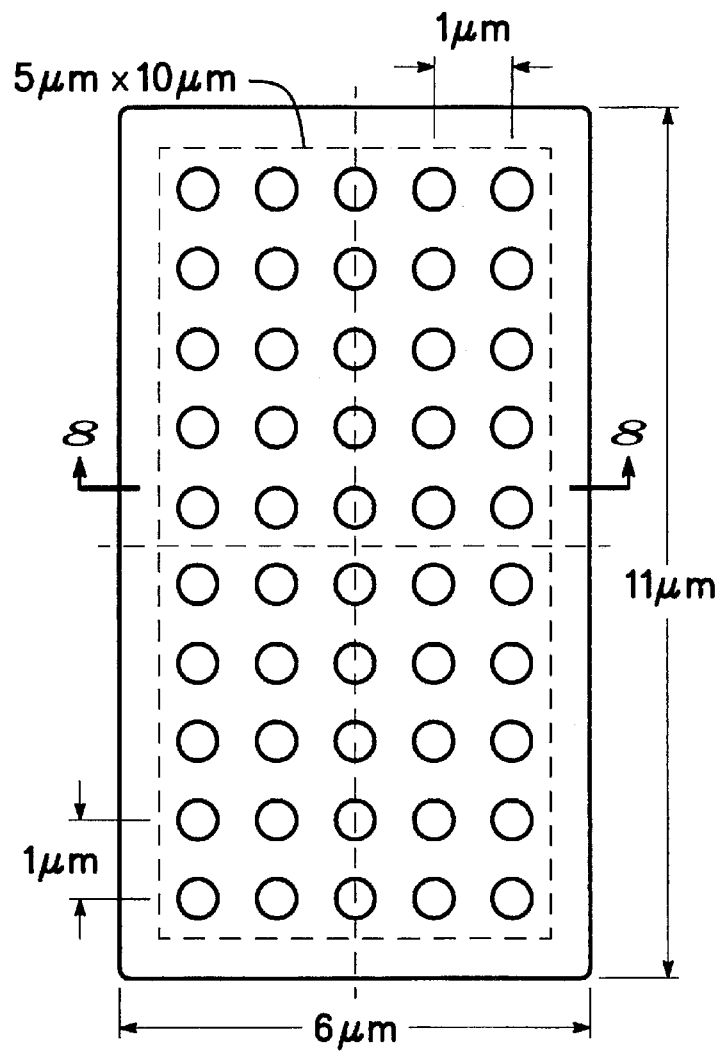
FIG. 7 is a top plan view similar to FIG. 2, illustrating another specific two dimensional array of electron emitters.
Figure 8:
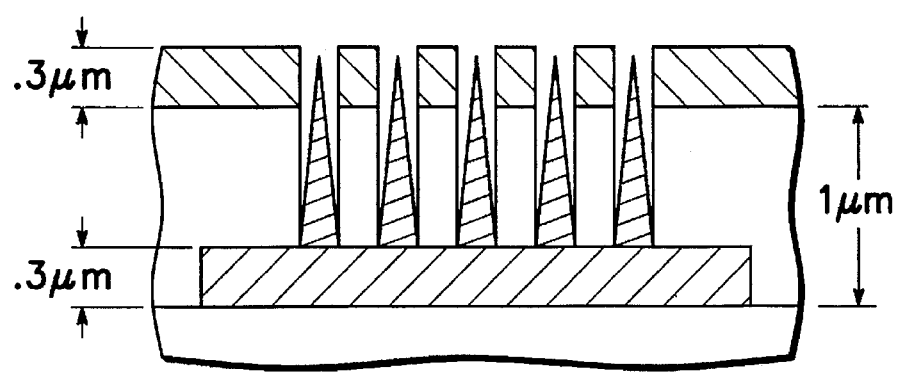
FIG. 8 is a sectional view as seen from the line 8—8 of FIG. 7.

A third embodiment of array 20 is illustrated in FIGS. 7 and 8 in which a more conservative center-to-center spacing of 1.0 μm is provided. A 5×10 tip array is disclosed and, as can be seen most clearly in FIG. 8, the emitter base (conducting layer 25) is approximately 0.30 μm thick, insulating layer 26 is approximately 1.0 μm thick, and the control electrode (second conducting layer 27) is approximately 0.30 μm thick. As is understood by those skilled in the art, when fabricating Spindt tips the thickness of insulating layer 26 is directly dependent upon the diameter of openings 28 and, thus, the height of tips 22. The larger tip spacing in the embodiment illustrated in FIGS. 7 and 8 allows a thicker insulating layer 26, which results in a greater spacing between the emitter base (conducting layer 25) and the extractor electrode (second conducting layer 27). This greater spacing in turn reduces extractor-to-base capacitance and allows for potentially higher blanking speeds (to be explained presently).

Figure 9:
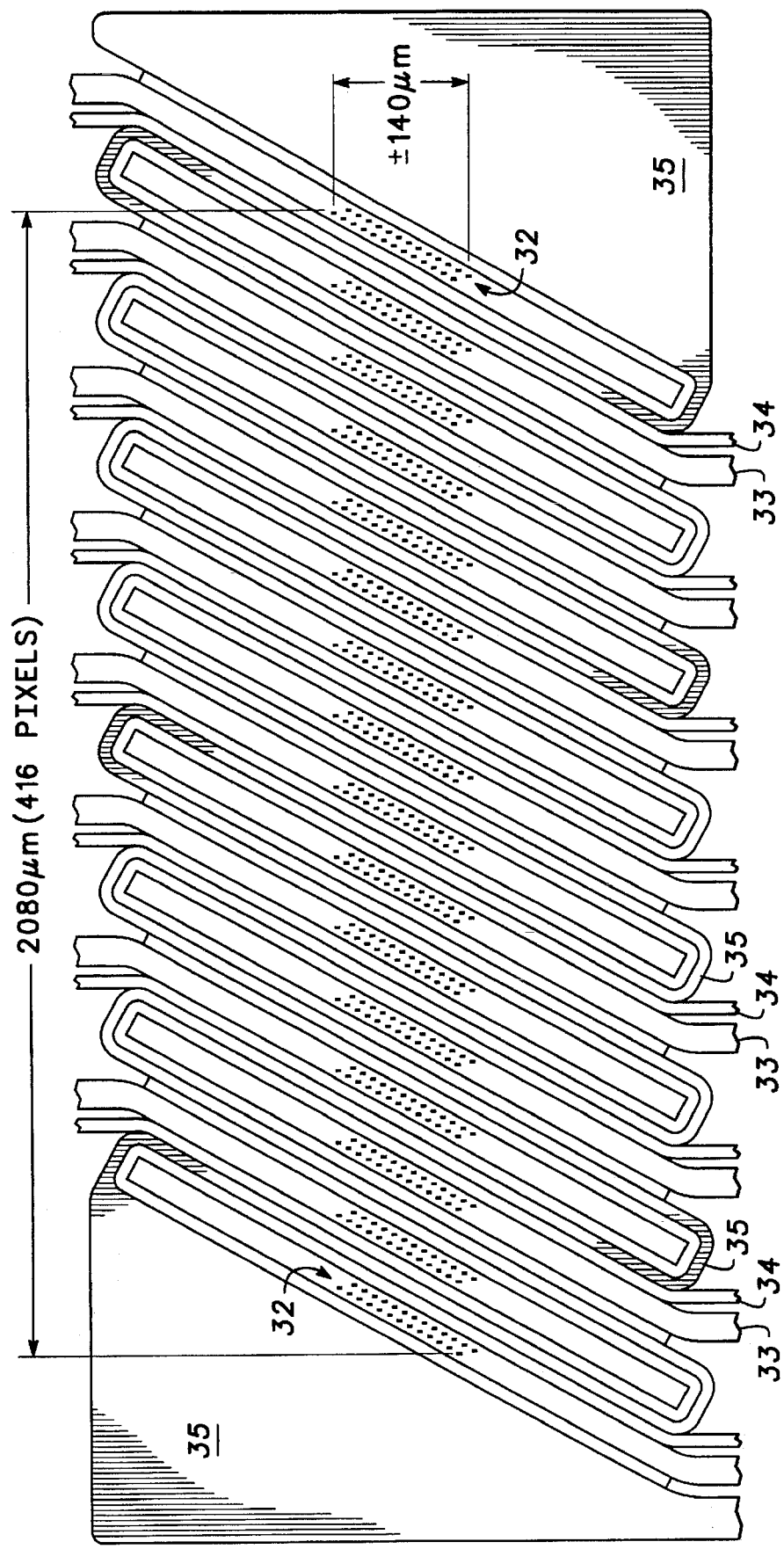
FIG. 9 is an enlarged top plan view of an electron source in accordance with the present invention.

Now referring specifically to FIG. 9, an enlarged top plan view of an illuminating (electron) source 30, in accordance with the present invention is illustrated. Electron source 30 includes a non-orthogonal row-column matrix of two dimensional arrays of electron emitters, with each array being similar to generic array 20 (see FIG. 2). As will be explained presently, each array (e.g. generic array 20) operates as a single pixel illuminator with each illuminator exposing a separate pixel on a portion of a surface on which illuminating source 30 is focused. It should be understood that arrays of electron emitters, and specifically field emission emitters, are utilized herein as illuminators for convenience of explanation, but other pixel illuminators could be substituted if desired. The arrays within the row-column matrix are arranged in a plurality of column groups 32 of arrays. In this specific embodiment, a total of sixteen column groups 32 each contain twenty six separate arrays of electron emitters. All sixteen column groups 32 are mounted in a common plane and may be, for example, all positioned on a common supporting substrate 24.

In FIG. 9, each column group 32 has a common elongated control or extractor electrode 33 with alternate extractor electrodes 33 extending vertically downward and upward, for connection to an external voltage source (not shown). Each extractor electrode 33 has a separate elongated, generally U-shaped field compensating electrode 34 positioned adjacent thereto, with the plurality of field compensating electrodes 34 being positioned in a common plane with extractor electrodes 33. As will be understood from the previous explanation of extractor electrode 27 in conjunction with FIG. 1, the plane containing extractor electrodes 33 and field compensating electrodes 34 is spaced from the emitter base (conducting layer 25) by the thickness of the insulating layer 26. A single surrounding electrode 35 is positioned in the common plane with extractor electrodes 33 and field compensating electrodes 34 so that portions of surrounding electrode 35 extend between adjacent field compensating electrodes. In FIG. 9, surrounding electrode 35 completes each end of source 30 and is entwined between adjacent field compensating electrodes 34 in a continuous serpentine fashion.

As will be explained in more detail presently, each of the column groups 32 of arrays 20 are positioned along an axis (generally referred to as the row axis) extending horizontally, or in the X direction, in FIG. 9 and are spaced from adjacent column groups 32. Further, each of the column groups 32 are arranged with the arrays 20 in each column group 32 spaced apart along a column axis, at an angle to the row axis, so that the arrays 20 are evenly spaced when projected into the row axis direction. Thus, while the vertical position of each array 20 varies by a maximum of ±half the length of a column group 32 (±140 μm in this embodiment), all of the arrays 20 are equally spaced along the horizontal row axis.

Figure 10:
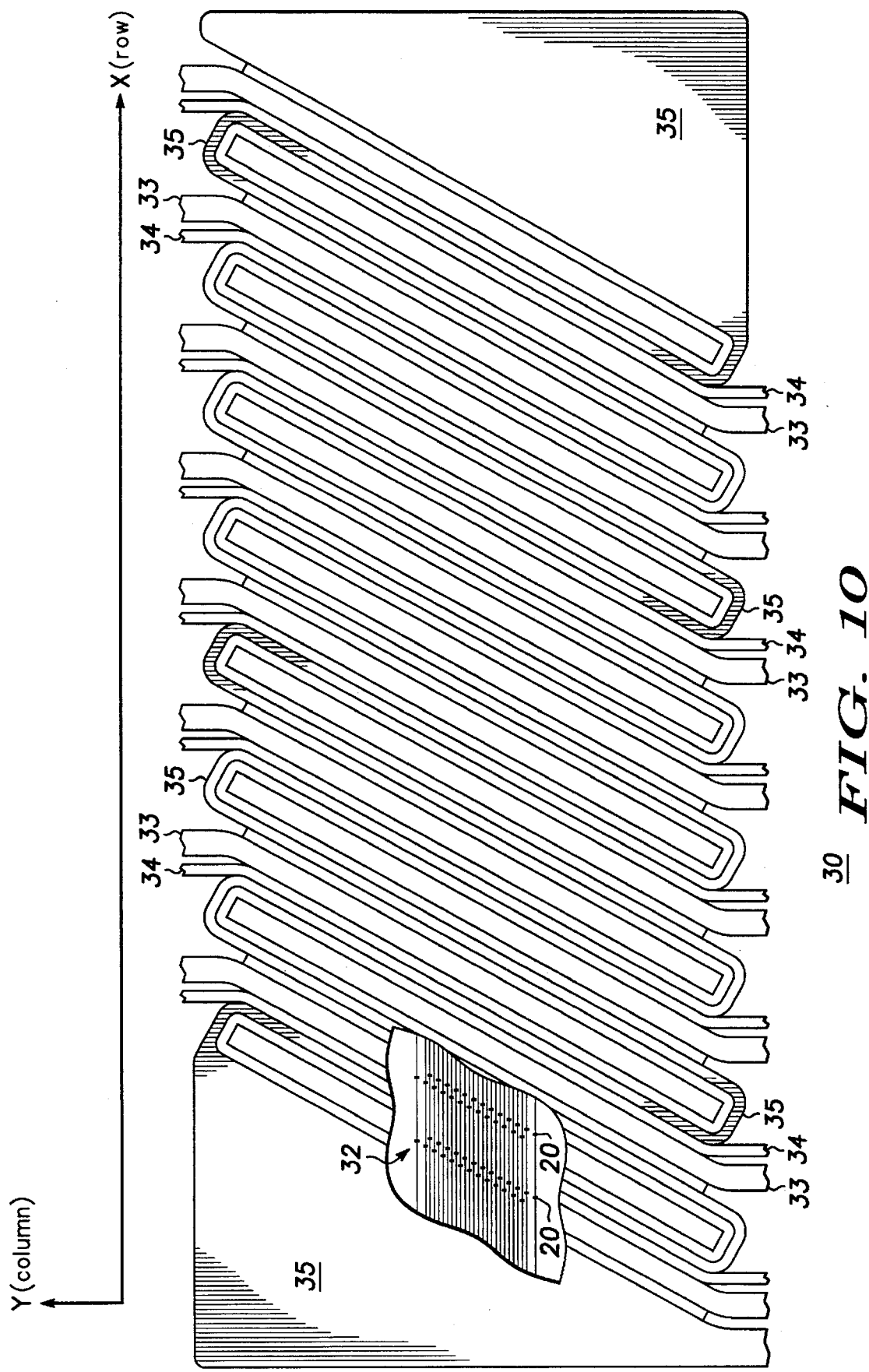
FIG. 10 is a top plan view similar to FIG. 9, with portions thereof removed to more conveniently illustrate inner connections.

Now referring to FIG. 10, a view similar to FIG. 9 is illustrated with portions of control electrodes 33, field compensating electrodes 34 and surrounding electrode 35 removed to illustrate individual row connections to arrays 20 of column groups 32. Each column group 32 includes twenty six separate arrays 20 of electron emitters, which arrays 20 are arranged in two angled rows of thirteen arrays each, as can be seen more clearly in the enlarged view of FIG. 11. Each array 20 is positioned within its column group 32 with its shortest dimension (N tips) oriented horizontally and its longest dimension (2N tips) oriented vertically. Further, as can be seen most clearly in the greatly enlarged view of FIG. 12, the angle at which each column group 32 is positioned relative to the horizontal row axis is such that all of the arrays 20 are equally spaced when projected into the horizontal row axis.

Figure 12:
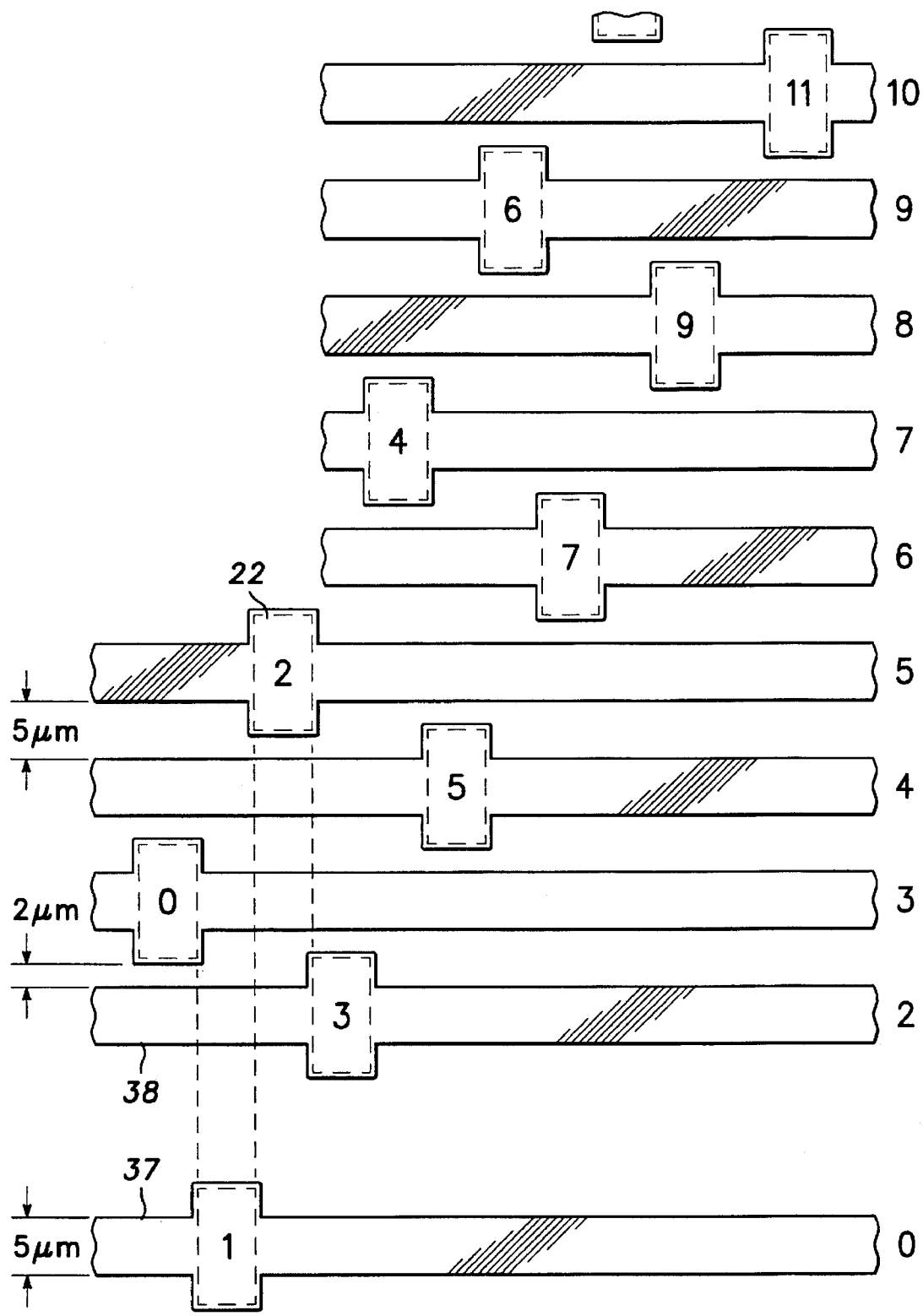
FIG. 12 is a greatly enlarged top plan view of a portion of FIG. 11.

Referring to FIG. 12, a portion of a single column group 32 of arrays 20 is illustrated in a greatly enlarged view. The thirteen arrays 20 in the first angled column of column group 32 have even column numbers starting with "0" while the thirteen arrays 20 in the second angled column have odd column numbers starting with "1". It should be specifically noted that each array 20 is positioned, in a horizontal direction (the row axis), so that the rightmost column of emitter tips within each array 20 (e.g. the "0" array) is horizontally spaced from the leftmost column of emitter tips within the next array 20 (e.g. the "1" array) the same distance that it is spaced from the next to the rightmost column of emitter tips in its own array 20 (i.e., the "0" array).

Figure 11:
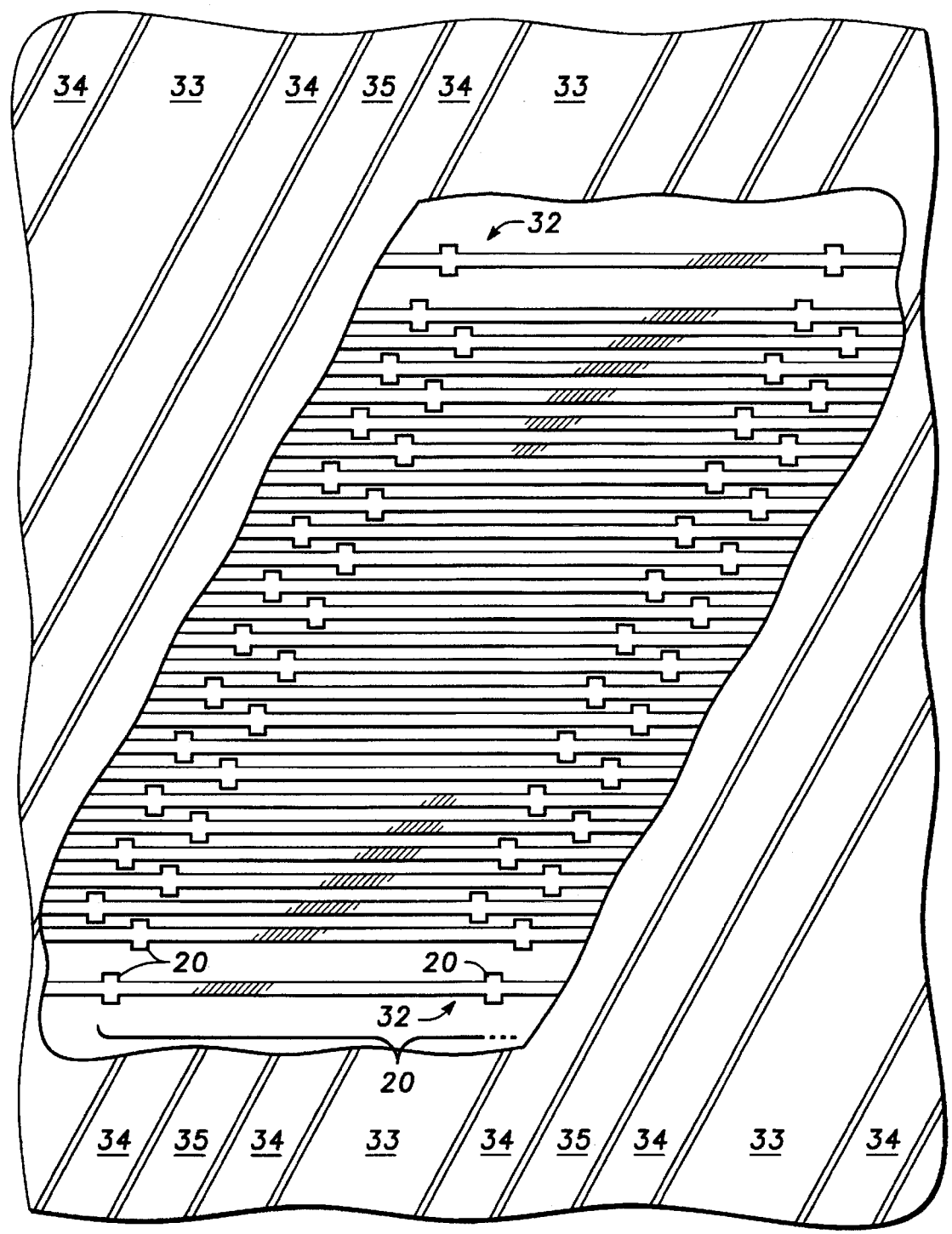
FIG. 11 is an enlarged top plan view of the inner connections illustrated in FIG. 10.

As further illustrated most clearly in FIGS. 11 and 12, similarly column-numbered arrays 20 in each column group 32 are electrically connected to a common electrical conductor to form row groups 26 of arrays 20. Thus, the first array 20 (starting at the bottom and moving vertically upward) in each column group 32 is connected to the first array 20 in each of the other fifteen column groups 32 to form a row group 26. As can be seen most clearly in FIG. 12, a five micron wide row conductor 37 connects all sixteen of the arrays 20 with column number "1", forming a row group 26. Similarly, a 5 μm wide row conductor 38 connects all sixteen of the arrays 20 with column number "3", forming a second row group 26. Thus, a plurality of electrical row conductors 37, 38, etc., equal in number to the plurality of arrays 20 in each column group 32 (twenty six in this embodiment) are utilized to connect arrays 20 into row groups 26.

In this embodiment, a 5 μm spacing is provided between adjacent row conductors 37, 38, etc., which is sufficient to leave a 2 μm gap between each array 20 and the next adjacent row conductor. As will be understood by those skilled in the art, row conductors 37, 38, etc. are patterned on a substrate (e.g. substrate 24 of FIG. 1) and the tip base (layer 25 in FIG. 1) is patterned on the substrate as an integral portion of row conductors 37, 38, etc. Thus each individual array 20 in electron source 30 is individually and exclusively addressable by selecting a specific row conductor 37, 38, etc. and a specific extractor electrode 33. Also, a plurality of arrays 20 (one from each column group 32) can be activated simultaneously so that any number of beams, from one to sixteen, can be generated simultaneously.

Figure 13:
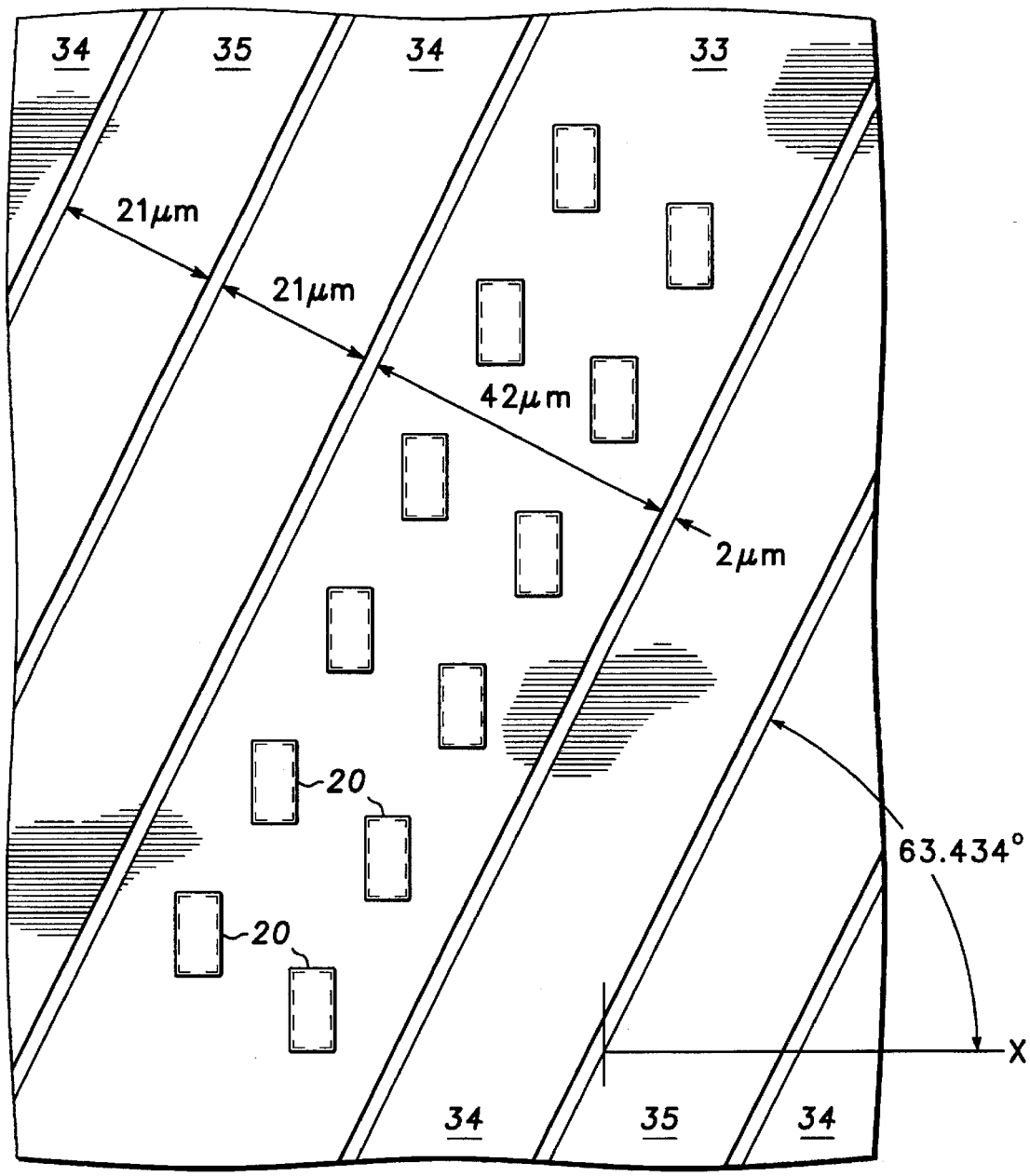
FIG. 13 is an enlarged view of a portion of FIG. 9 illustrating various angles and sizes of components.

Referring specifically to FIG. 13, an enlarged view of a portion of source 30 of FIG. 9 illustrates various angles and sizes of components. It can be seen that the illustrated column group 32 of arrays 20 and the associated control electrode 33 are positioned at an angle of the arctangent (2)=63,434 degrees with respect to the horizontal row axis. The angle defined between groups 32 and the row axis can vary between 45 and 80 degrees, depending upon spacings and sizes of the various components, with the important feature being the spacing between adjacent arrays when projected into the row axis.

In this specific embodiment, control electrode 33 is 42 μm wide with a 21 μm wide field compensating electrode 34 positioned on each side thereof and spaced from control electrode 33 by a 2 μm gap. Also, portions of surrounding electrode 35 extend between adjacent field compensating electrodes 34 and are spaced therefrom by a 2 μm gap. Thus, control electrodes 33, field compensating electrodes 34 and surrounding electrode 35 are all spaced from each other and electrically separated so that different potentials can be applied thereto.

The following specific example of the operation of source 30 and the potentials utilized are only for purposes of explanation of the operation of the source 30 and are not intended to limit the invention in any way. Referring again to FIG. 12, each array 20 connected to row conductor 37 has column label "1", each array 20 connected to row conductor 38 has column label "3", etc. Initially, all twenty six row conductors 37, 38, etc. are biased to −5900 volts, an OFF condition. Control electrodes 33 (FIG. 13) can be at either −5900 volts or −6000 volts. Field compensating electrodes 34 (FIG. 13) can be either −5900 volts or −5800 volts, as will be explained in more detail presently. Surrounding electrode 35 is always at −5900 volts.

Initially the voltages on all row conductors 37, 38, etc. are set at −5900 volts. Extractor electrodes 33 and field compensator electrodes 34 for each of the sixteen groups 32 are both set at −5900 volts if the column "1" array 20 of that column group is to be activated. If the column "1" array of that column group is not to be activated, the extractor electrode 33 for that column group is set at −6000 volts and the field compensator electrode 34 is set at −5800 volts. After setting the voltages at the desired levels and allowing time for the voltages to stabilize, the potential on row conductor 37 (row "1") is changed from −5900 volts to −6000 volts, which turns ON all arrays with an extractor electrode at −5900 volts (a net positive 100 volt differential). After allowing a necessary writing time (based on the blanking speed), the potential on row conductor 37 is restored to −5900 volts. The above procedure is repeated for each of the remaining twenty five rows with column numbers "3", "0", "5", "2", etc. (row conductor 38, etc.).

Assuming that source 30 is being used for an electron source in a lithography system for writing on semiconductor wafers, after the above procedure has been completed on all twenty six rows (column numbers "0" through "25 "), the wafer being written on is moved a distance of one pixel (e.g. the length of one array 20 as imaged onto the wafer surface) in the Y direction, orthogonal to the X direction. The above procedure is then repeated for all twenty six column numbers "0" through "25". This procedure is then repeated over the full width of the wafer in the Y directions, thus writing a strip of approximately 100 μm width in the X (row) direction. The wafer is then stepped in the X direction a distance equal to the width of the strip being written and the entire procedure is repeated moving back parallel to the Y-axis in the opposite direction.

Figure 14:
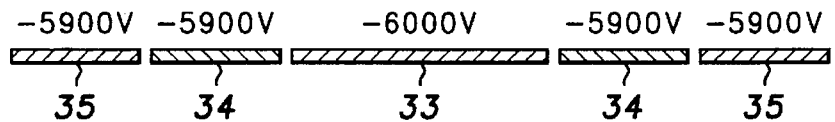
FIGS. 14 and 15 are similar enlarged sectional views of a portion of FIG. 13, under two different operating modes.
Figure 15:
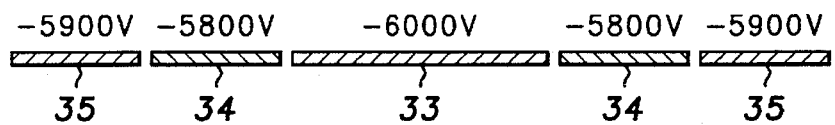
Figure 16:
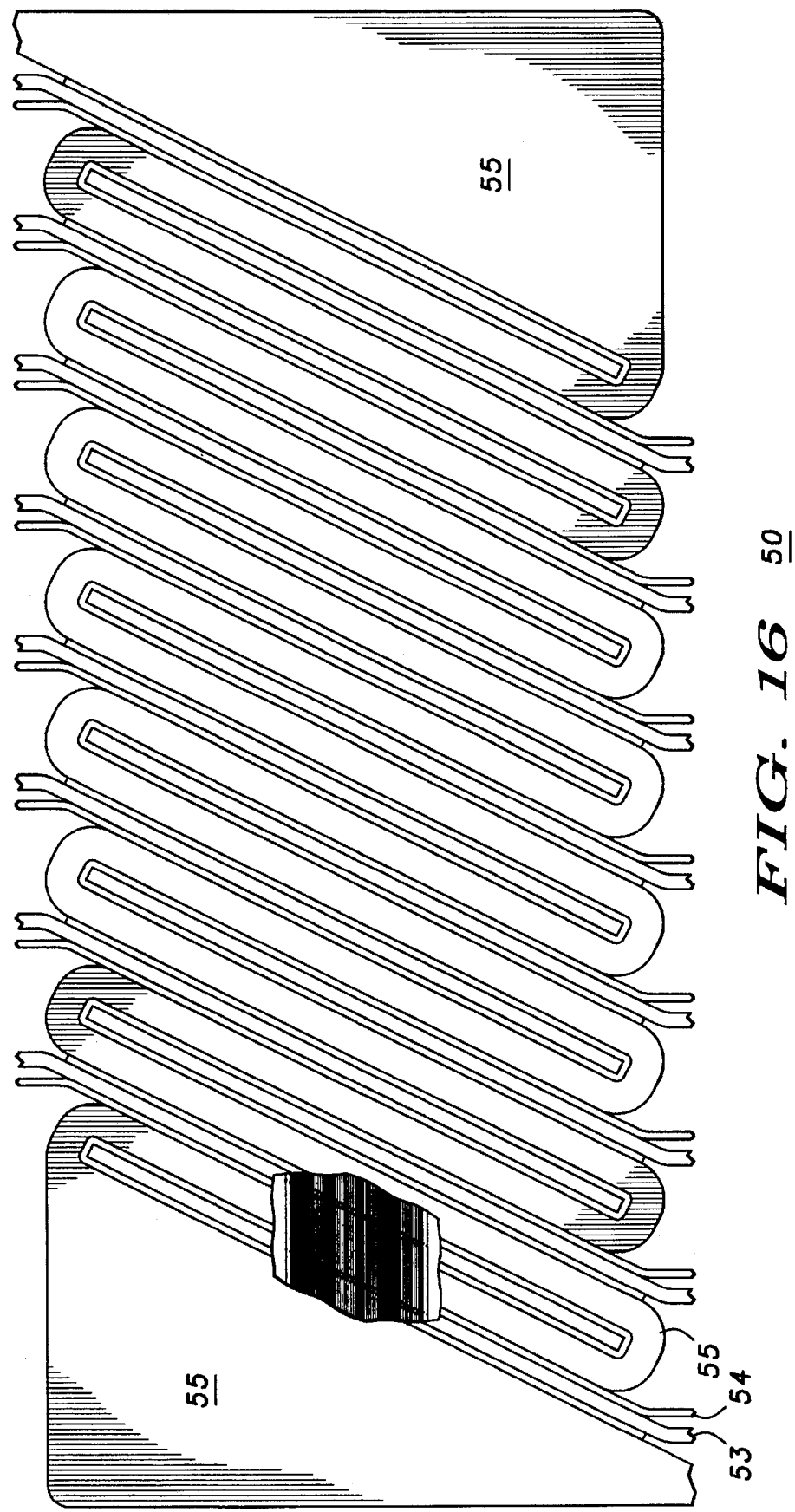
FIGS. 16–19 are views, similar to FIGS. 10–13, of another embodiment of an electron source in accordance with the present invention.
Figure 17:
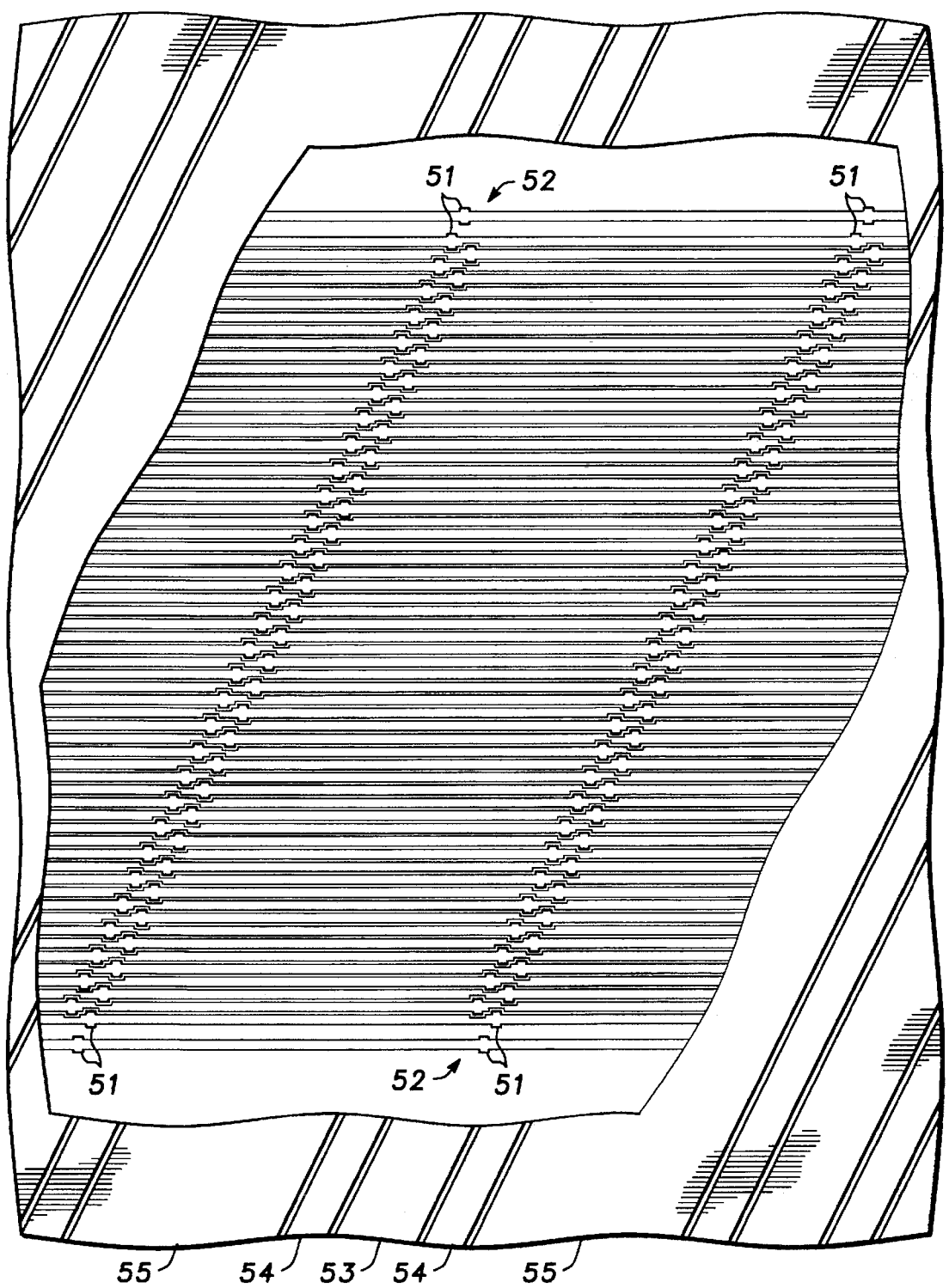

Due to the close proximity of adjacent control electrodes 33, there is a potential for "crosstalk" between the various beams being simultaneously emitted from the sixteen groups 32 of arrays 20. Proper operation of source 30 requires nearly complete correction for this effect and, to this end, field compensating electrodes 34 are included in source 30. Referring to FIGS. 14 and 15, two simplified cross-sectional views of a portion of source 30 are illustrated to explain the operating principal of field compensators 34.

In the mode of operation illustrated in FIG. 14, extractor electrode 33 is at −6000 volts, corresponding to an OFF array 20. Field compensating electrodes 34 are set to −5900 volts, i.e. they are inactivated, and surrounding electrode 35 is at the normal −5900 volts. Since the potential on extractor electrode 33 is at a −100 volt potential relative to field compensating electrode 34 and surrounding electrode 35, this corresponds to a net relatively negative charge distributed over the length of extractor electrode 33, which is much longer than the column group 32 of arrays 20, thus appearing as an effectively infinitely long linear charge distribution to the electron beams emerging from any neighboring column groups 32 of arrays 20. Since the electric field from a line charge distribution decays as 1/R, where R is the distance away from extractor 33 (measured perpendicular to the axis of extractor 33), the beam deflection effects of this line charge can potentially be very long range.

Referring now to FIG. 15, a second mode of operation is illustrated in which compensating electrodes 34 are activated. In this mode, extractor electrode 33 is again at −6000 volts, corresponding to an OFF array 20. Field compensating electrodes 34 are set to −5800 volts, i.e. they are activated, and surrounding electrode 35 is at the normal −5900 volts. The width of each of the two field compensating electrodes 34 is half the width of extractor electrode 33 and the −5800 volt potential results in a net +100 volt potential relative to surrounding electrode 35. The combination of field compensating electrodes 34 and extractor electrode 33 corresponds to a linear quadrapole field, in contrast to the linear monopole field of extractor electrode 33 alone (FIG. 14 above). Since the field from a linear quadrapole decays as $1/R^3$, the electrostatic deflection effect on nearby electron beams is greatly reduced.

It should be noted that field compensating electrodes 34 are always inactive (set at −5900 volts) when the associated extractor electrode 33 is ON (also set at −5900 volts). A specific field compensating electrode 34 is active (−5800 volts) when the associated extractor electrode 33 is OFF (set at −6000 volts).

Figure 18:
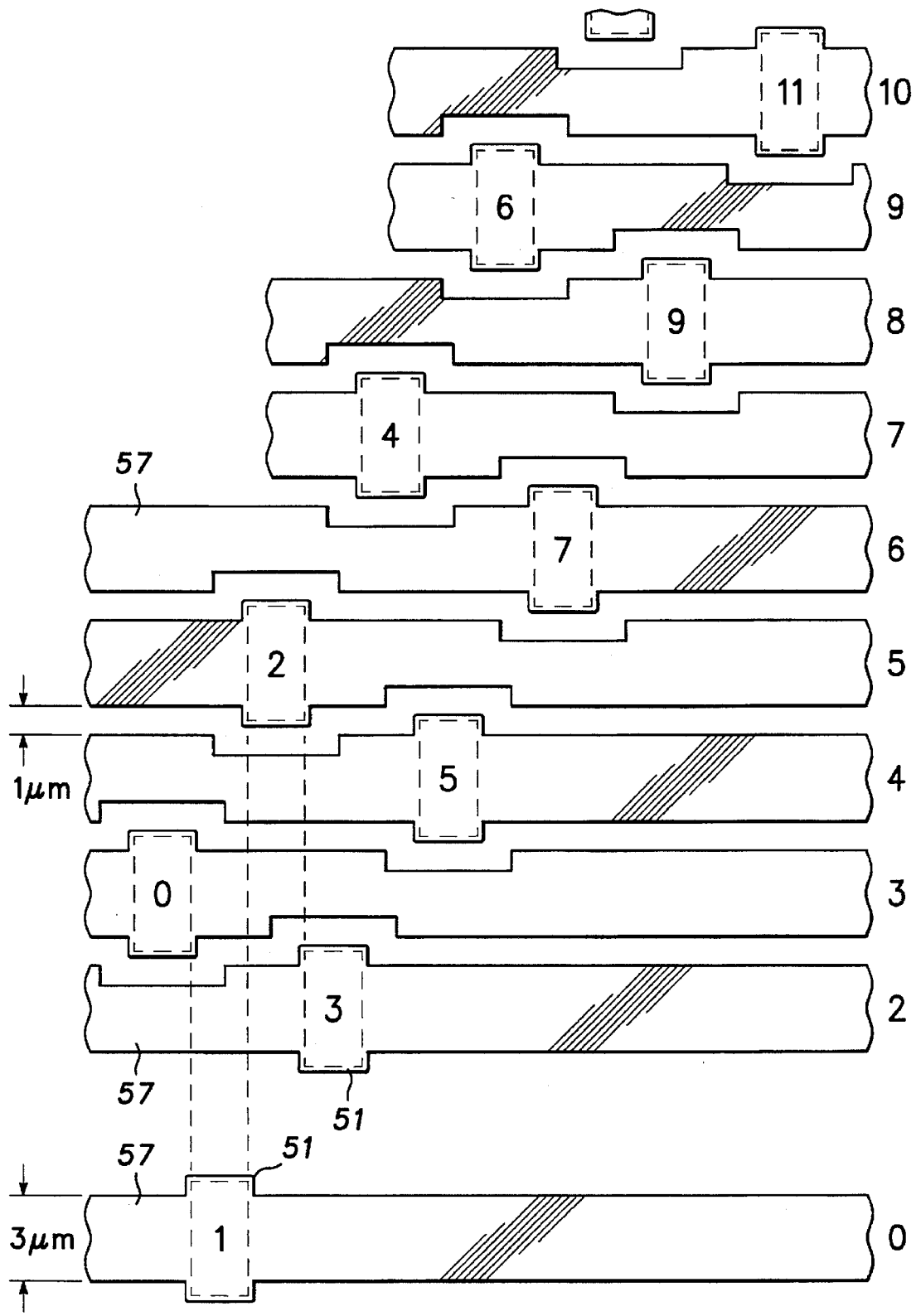
Figure 19:
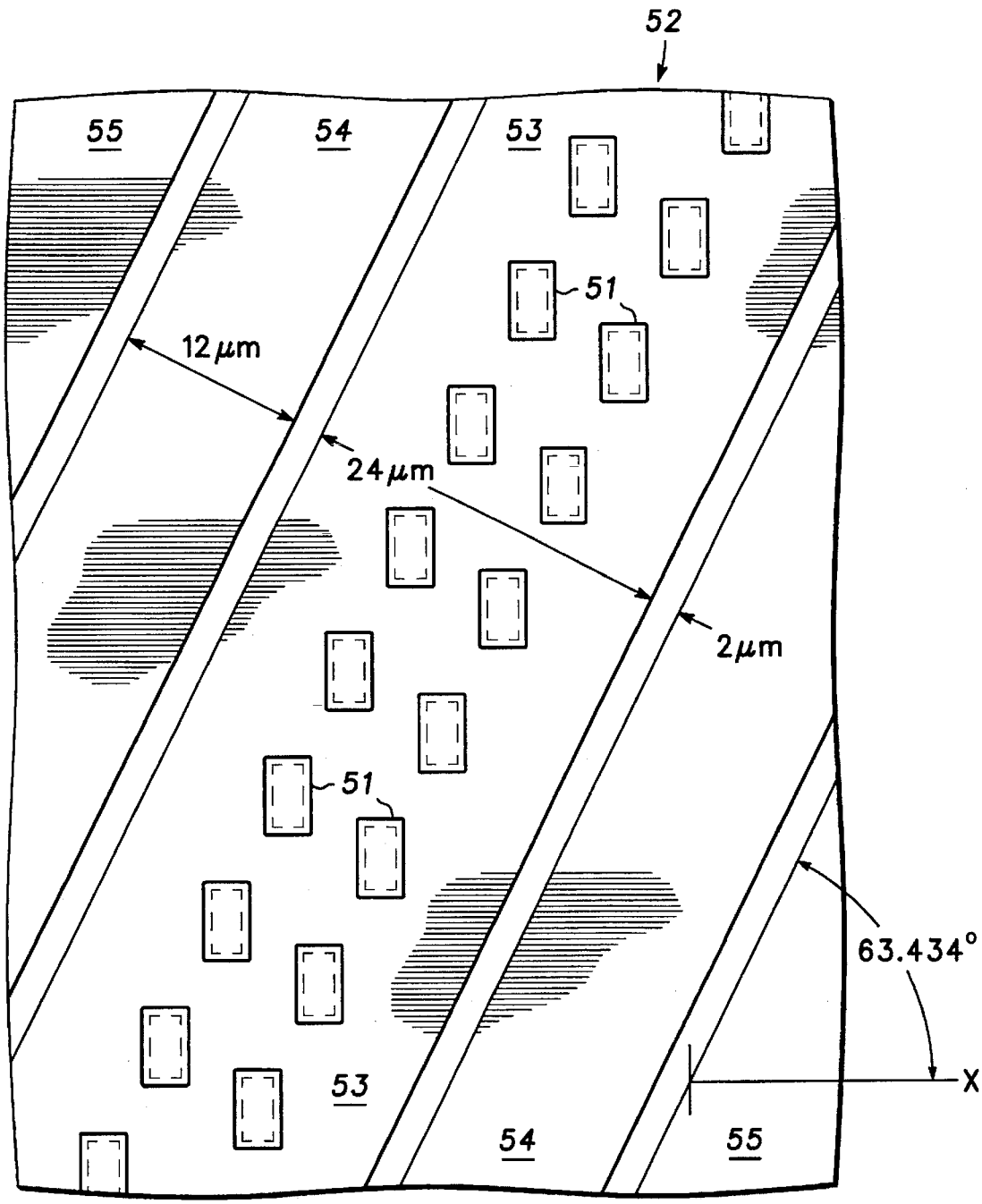

Turning now to FIGS. 16–19, an embodiment of an electron source 50, which is somewhat different than electron source 30 of FIG. 9, is illustrated. Source 50 again includes a row-column matrix of arrays 51 of electron emitters arranged in a plurality of column groups 52, each with an associated control electrode 53, field compensating electrodes 54 and surrounding electrode 55. The major difference in source 50 is that it is designed for a smaller pixel size (higher lithographic resolution) than source 30 and, therefore, contains more arrays 51 of electron emitters in each column group 52. In this specific embodiment, there are sixteen column groups 52 with each column group 52 containing sixty four arrays 51 (see FIG. 17). As can be seen in FIG. 18, arrays 51 are positioned closer together so that row conductors 57 are only 3 μm wide and there is only a 1 μm spacing between conductors. The extractor tilt angle relative to the row axis is again arctan(2), or 63.434 degrees. However, as illustrated most clearly in FIG. 19, the width of extractor electrodes 53 is only 24 μm and the width of field compensating electrodes 54 is 12 μm (one half the width of extractor electrodes 53).

Figure 20:
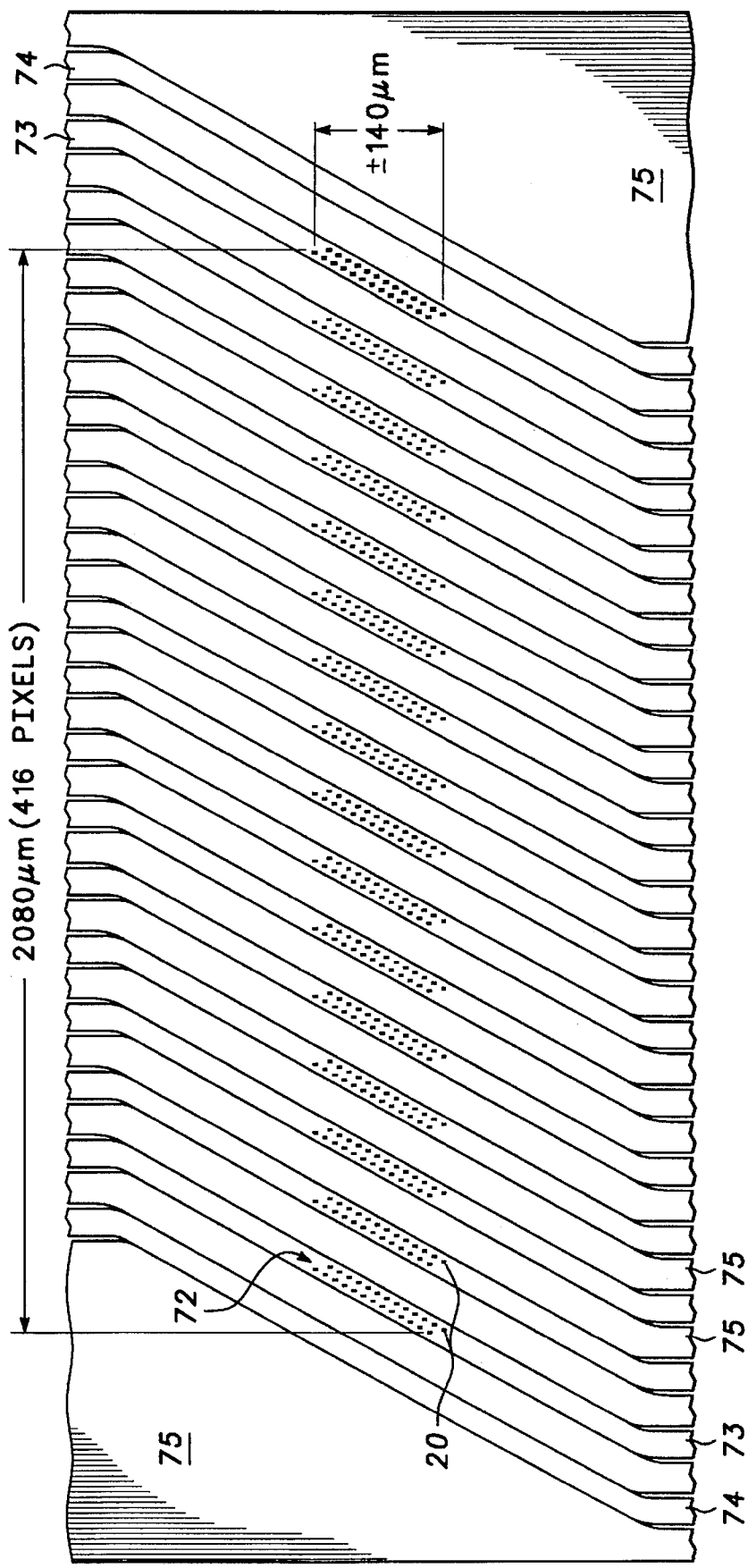
FIGS. 20 and 21 are views of another embodiment of an electron source in accordance with the present invention.

A third embodiment of the electron source is illustrated in FIGS. 20–24, in which a different pixel addressing mode from that shown for FIGS. 9–19 is utilized. Referring to FIG. 20, electron source 70 includes a non-orthogonal row-column matrix of two dimensional arrays of electron emitters, with each array being similar to generic array 20 (see FIG. 2). The arrays within the row-column matrix are arranged in a plurality of column groups 72 of arrays. In this specific embodiment, a total of sixteen column groups 72 each contain twenty six separate arrays 20 of electron emitters. All sixteen column groups 72 are mounted in a common plane and may be, for example, all positioned on a common supporting substrate 24.

Each column group has a common elongated extractor electrode 73 extending vertically in FIG. 20 for connection to an external voltage source (not shown). At each end of the plurality of column groups, a dummy extractor 74 is positioned, at a spacing relative to the neighboring extractor electrode 73 equal to the spacing between each pair of neighboring extractor electrodes 73. Between each pair of extractor electrodes 73 and between each dummy extractor 74 and its neighboring extractor electrode 73 is an elongated surrounding electrode 75. Electrodes 73, 74 and 75 may be positioned in a common plane. As should be understood from the previous explanation of extractor electrode 27 in conjunction with FIG. 1, the common plane containing electrodes 73, 74 and 75 is spaced from the emitter base (conducting layer 25) by the thickness of the insulating layer 26.

Each of the column groups 72 of arrays 20 is positioned along a row axis extending horizontally in FIG. 20 and are spaced from adjacent column groups 72. Further, each of the column groups 72 is arranged with the arrays 20 in each column group 72 spaced apart along a column axis, at an angle to the row axis, so that the arrays 20 are evenly spaced when projected into the row axis direction.

Figure 21:
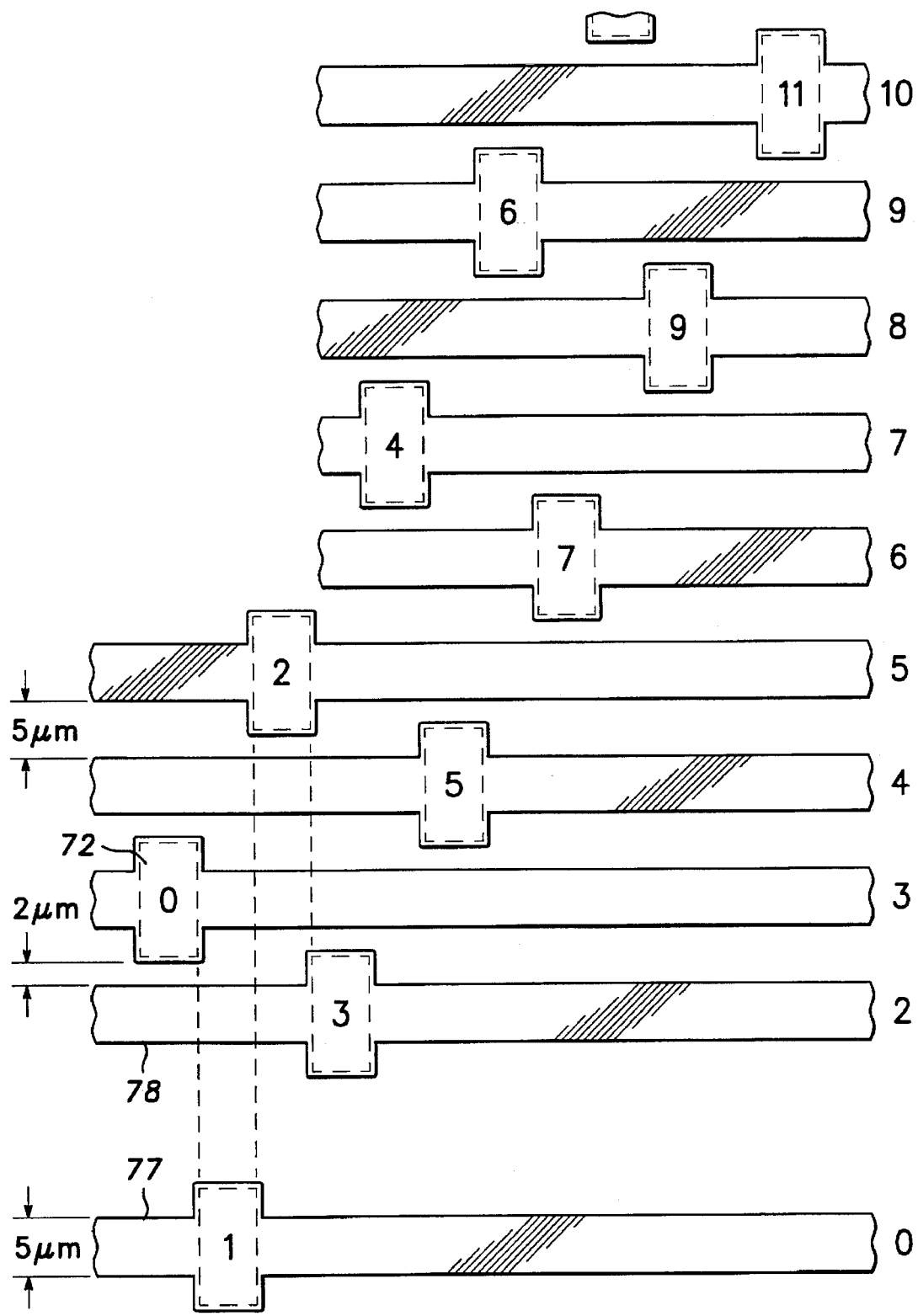

The electrical connections to each array 20 within source 70 are shown in greatly expanded view in FIG. 21. A 5 µm spacing is provided between adjacent row conductors 77, 78, etc., which is sufficient to leave a 2 µm gap between each array 20 and the next adjacent row conductor. As will be understood by those skilled in the art, row conductors 77, 78, etc. are patterned on a substrate (e.g. substrate 24 of FIG. 24) and the tip base (layer 25 in FIG. 1) is patterned on the substrate as an integral portion of row conductors 77, 78, etc. Thus each individual array 20 in electron source 70 is individually and exclusively addressable by selecting a specific row conductor 77, 78, etc. and a specific extractor electrode 73. Also a plurality of arrays 20 (all from a single column group) can be activated simultaneously so that any number of beams, from one to twenty six, can be generated simultaneously.

The following specific example of the operation of source 70 and the potentials utilized are only for purposes of explanation of the operation of source 70 and are not intended to limit the invention in any way. Referring to FIGS. 20 and 21, each array 20 connected to row conductor 77 has column label "1", each array 20 connected to row conductor 78 has column label "3", etc. Initially, all twenty six row conductors 77, 78, etc. are biased to –5900 volts, an OFF condition. Control electrodes 73 (FIG. 20) are set to –6000 volts. Dummy extractor electrodes 74 are set at –6000 volts and surrounding electrode 75 is set at –5900 volts.

Row conductor 77 is set to –6000 volts if the column "1" array is to be activated and is set to –5900 volts if the column "1" array is to be inactivated. Similarly, row conductors 78, etc. are set depending on the desired status of column arrays "3", "0", etc. After setting the voltages at the desired levels and allowing time for the voltages to stabilize, the potential on the leftmost extractor electrode 73 is changed from –6000 volts to –5900 volts, which turns ON all arrays within the leftmost column group 72 with row conductors at –6000 volts (a net positive 100 volt differential). After allowing a necessary writing time (based on the blanking speed), the potential on the leftmost control electrode 73 is restored to –6000 volts. The above procedure is repeated for each of the remaining fifteen control electrodes 73.

Assuming that source 70 is being used for an electron source in a lithography system for writing on semiconductor wafers, after the above procedure has been completed on all sixteen column groups, the wafer being written on is moved a distance of one pixel in the Y direction (perpendicular to the row axis). The above procedure is then repeated for all sixteen column groups. This procedure is then repeated over the full width of the wafer in the Y direction, thus writing a strip of approximately 100 µm in width in the X (row) direction. The wafer is then stepped in the X direction a distance equal to the width of the strip being written and the entire procedure is repeated moving back parallel to the Y axis in the opposite direction.

Figure 22:
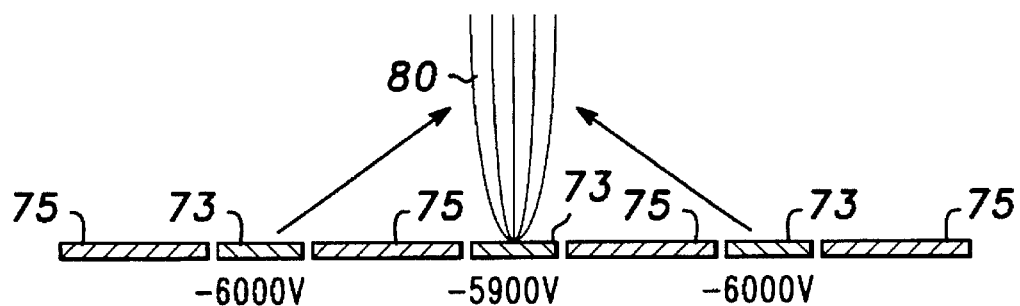
FIGS. 22–24 are views explaining the operation of the dummy control electrodes.
Figure 23:
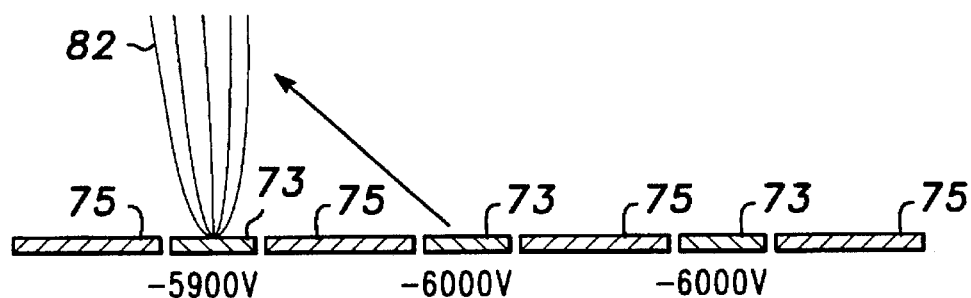

Due to the close proximity of adjacent control electrodes 73, there is an electron optical focusing and deflection effect on the various beams being simultaneously emitted from the twenty six arrays 20 within a single column group 72 in electron source 70. For most column groups 72, there are two adjacent OFF extractor electrodes 73 (at –6000 volts), symmetrically positioned one on each side of the ON extractor electrode 76 (at –5900 volts), as illustrated in FIG. 22. This induces a symmetrical focusing and deflection force on the electron beams 80 being emitted from column group 72. For the leftmost and rightmost column groups 72, there is only one neighboring OFF control electrode 73 (at –6000 volts), as illustrated in FIG. 23. This causes an asymmetrical deflection force on the electron beams 82 being emitted from column group 72.

Figure 24:
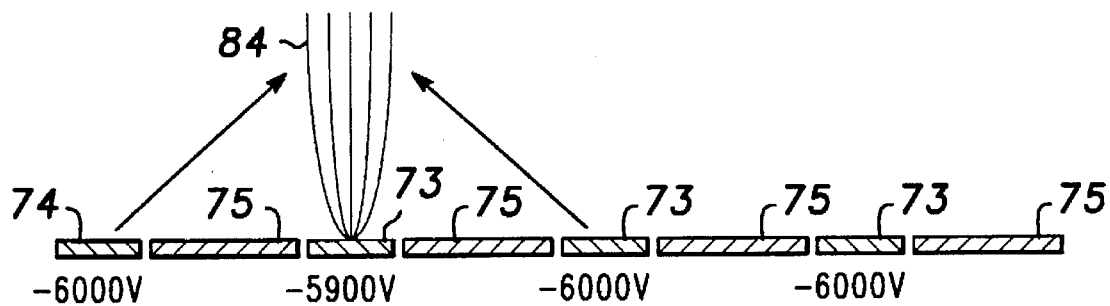

FIG. 24 illustrates the operation of the dummy extractor 74. Both dummy extractors are always set to –6000 volts. When extractor electrode 76 is activated (set to –5900 volts), the neighboring extractor electrode 73 is always OFF (set to –6000 volts) since for this source design only one control electrode is activated at a time. The combination of the electrostatic force on electron beams 84 from dummy control electrode 74 and control electrode 73 is a symmetrical force identical to that shown in FIG. 22 on electron beam 80.

Accordingly, a new and improved electron source is disclosed enabling higher resolution than prior art optical lithography systems and which can write much faster than prior art electron sources. Specifically, the new and improved electron source can conveniently be used in multibeam electron lithography systems to render the systems much more compliant and versatile, since the new and improved electron source can be configured in an X-Y matrix of electron sources wherein each source is utilized to pattern a single integrated circuit, and sufficient sources are provided to enable simultaneous patterning of an entire wafer of any size. Further, the new and improved electron source eliminates the need for X-Y beam scan deflectors, thereby simplifying the overall electron optics structure, and greatly reduces the current requirement for each individual electron emitter utilized, thereby allowing the use of very small electron emitters, such as field emission devices.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. An electron source for use in an electron beam lithography system and including a plurality of independently-controllable electron emitter arrays, each array exposing a separate pixel on a portion of the surface on which the source is focused, the source comprising:

a non-orthogonal row-column matrix of two-dimensional arrays of electron emitters mounted in a first plane and including a plurality of column groups of arrays of electron emitters, each of the plurality of column groups of arrays of electron emitters including a plurality of two dimensional arrays of electron emitters, the plurality of two dimensional arrays of electron emitters in each column group being arranged in a plurality of rows of arrays and a plurality of columns of arrays that are non-orthogonal to the rows of arrays;

a plurality of control electrodes, mounted in a second plane parallel with and spaced from the first plane, with each control electrode of the plurality of control electrodes being mounted adjacent an associated one of the plurality of column groups of arrays and positioned in spaced relation from each electron emitter in the associated one of the column groups of arrays; and a plurality of electrical connections at least equal in number to the plurality of arrays in each column group, the plurality of electrical connections connecting the electron emitters in each array in parallel and connecting a single array in each column group to a similar single array in each other column group in the row-column matrix of arrays so as to form a plurality of row groups of arrays equal in number to the plurality of arrays in each column group.

2. An electron source as claimed in claim 1 wherein the electron emitters in the two-dimensional arrays are field emission type emitters.

3. An electron source as claimed in claim 1 wherein each column group of arrays includes a first number of arrays, and wherein each row group of arrays includes a second number of arrays.

4. An electron source as claimed in claim 1 wherein each of the column groups of arrays in the row-column matrix of arrays is positioned along a row axis and in spaced apart relationship, the column groups of arrays being arranged with the arrays in each column group spaced apart along a column axis, at an angle to the row axis, so that the arrays are evenly spaced when projected into the row axis.

5. An electron source as claimed in claim 4 wherein the angle between the column axis and the row axis is between 45 degrees and 80 degrees.

6. An electron source as claimed in claim 4 wherein the angle between the column axis and the row axis is 63.434 degrees.

7. An electron source as claimed in claim 4 wherein the arrays in each column group are arranged in a plurality of spaced apart columns extending along the row axis.

8. An electron source as claimed in claim 7 wherein the electron emitters in each array of the row-column matrix of arrays are arranged to define a rectangle with a short side extending along the row axis and a long side extending perpendicular to the row axis.

9. An electron source as claimed in claim 8 wherein each of the two-dimensional arrays includes N electron emitters in lines parallel to the short side and 2N electron emitters in lines parallel to the long side, and wherein N is in the range of 2 to 10.

10. An electron source as claimed in claim 8 wherein the electron emitters are formed with center-to-center spacings in a range of 3 µm to less than 1 µm parallel to the short side, and with center-to-center spacings in a range of 3 µm to less than 1 µm parallel to the long side.

11. An electron source as claimed in claim 4 wherein each control electrode is coupled to have a first potential applied thereto in an ENABLED condition and a second potential applied thereto in a DISABLED condition, each array in a row group of arrays is coupled to have a third potential applied thereto in an ENABLED condition and a fourth potential applied thereto in a DISABLED condition, and wherein electron emission occurs only from any array in a row group which is ENABLED and which is associated with a control electrode which is ENABLED.

12. An electron source as claimed in claim 11 wherein the third potential is set equal to the second potential, and the fourth potential is set equal to the first potential.

13. An electron source as claimed in claim 11 wherein the control electrodes are spaced apart along the row axis, and the electron source includes in addition a plurality of field compensating electrodes, each control electrode having an associated pair of field compensating electrodes mounted adjacent the sides thereof along the row axis, the pairs being electrically connected to each other and electrically separated from the control electrodes and all other pairs of field compensating electrodes.

14. An electron source as claimed in claim 13 wherein each of the plurality of field compensating electrodes is coupled to have a fifth potential applied thereto when an control electrode associated therewith is in the ENABLED condition and a sixth potential applied thereto when the control electrode associated therewith is in the DISABLED condition.

15. An electron source as claimed in claim 13 including in addition a surrounding electrode mounted in the second plane and having portions extending between adjacent field compensating electrodes.

16. An electron source as claimed in claim 15 wherein the surrounding electrode is coupled to have the first potential applied thereto.

17. An electron source as claimed in claim 11 wherein a dummy control electrode is positioned at each end of the plurality of control electrodes.

18. An electron source as claimed in claim 17 wherein the dummy control electrodes are coupled to have the second potential applied thereto.

19. An electron source as claimed in claim 17 including in addition a surrounding electrode mounted in the second plane and having portions extending between adjacent control electrodes.

20. An electron source as claimed in claim 19 wherein the surrounding electrode is coupled to have the first potential applied thereto.

21. An illuminating source including a plurality of independently-controllable pixel illuminators, each illuminator exposing a separate pixel on a portion of the surface on which the source is focused, the source comprising:

a non-orthogonal row-column matrix of pixel illuminators mounted in a first plane and including a plurality of column groups of illuminators with each column group including a plurality of illuminators, each of the plurality of column groups of illuminators being positioned along a row axis in spaced apart relationship, the column groups of illuminators being arranged with the plurality of illuminators in each column group spaced apart along a column axis, at an angle to the row axis, so that the illuminators are evenly spaced when projected into the row axis;

a plurality of control electrodes, mounted in a second plane parallel with and spaced from the first plane, with each control electrode of the plurality of control electrodes being mounted adjacent an associated column group of illuminators and positioned in spaced relation from each illuminator in the associated column group of illuminators; and a plurality of electrical connections at least equal in number to the plurality of illuminators in each column group of illuminators, the plurality of electrical connections connecting the illuminators in each other column group of illuminators in the row-column matrix of illuminators so as to form a plurality of row groups of illuminators equal in number to the plurality of illuminators in each column group.

22. An electron source for use in an electron beam lithography system and including a plurality of independently-controllable electron emitter arrays, each array exposing a separate pixel on a portion of the surface on which the source is focused, the source comprising:

a non-orthogonal row-column matrix of two-dimensional arrays of field emission type electron emitters mounted in a first plane, the row column matrix including a plurality of column groups of arrays with each column group including a plurality of arrays, each of the column groups of arrays in the row-column matrix of arrays being positioned along a row axis in spaced apart relationship and arranged with the arrays in each column group spaced apart along a column axis at an angle to the row axis, so that the arrays in each column group are evenly spaced when projected into the row axis;

a plurality of control electrodes, mounted in a second plane parallel with and spaced from the first plane, with each control electrode of the plurality of control electrodes being mounted adjacent an associated column group of arrays and positioned in spaced relation from each electron emitter in the associated column group of arrays; and a plurality of electrical connections at least equal in number to the plurality of arrays in each column group, the plurality of electrical connections connecting the electron emitters in each array in parallel and connecting each array in each column group to a similar array in each other column group in the row-column matrix of arrays so as to form a plurality of row groups of arrays equal in number to the plurality of arrays in each column group.

23. An electron source as claimed in claim 22 wherein the angle between the column axis and the row axis is between 45 and 80 degrees.

24. An electron source as claimed in claim 22 wherein the electron emitters in each array of the row-column matrix of arrays are arranged to define a rectangle with a short side extending along the row axis and a long side extending perpendicular to the row axis.

25. An electron source as claimed in claim 24 wherein each of the two-dimensional arrays includes N electron emitters in lines parallel to the short side and 2N electron emitters in lines parallel to the long side, and wherein N is in the range of 2 to 10.

26. An electron source as claimed in claim 25 wherein the electron emitters are formed with center-to-center spacings in a range of 3 µm to less than 1 µm parallel to the short side, and with center-to-center spacings in a range of 3 µm to less than 1 µm parallel to the long side.

27. An electron source as claimed in claim 22 wherein each control electrode is coupled to have a first potential applied thereto in an ENABLED condition and a second potential applied thereto in a DISABLED condition, each array in each row group of arrays is coupled to have a third potential applied thereto in an ENABLED condition and a fourth potential applied thereto in a DISABLED condition, and wherein electron emission occurs only from any array in each row group which is ENABLED and which is associated with an control electrode which is ENABLED.

28. An electron source as claimed in claim 27 wherein the control electrodes are spaced apart along the row axis, and the electron source includes in addition a plurality of field compensating electrodes, each control electrode having an associated pair of field compensating electrodes mounted adjacent the sides thereof along the row axis, the pairs being electrically connected to each other and electrically separated from the control electrodes and all other pairs of field compensating electrodes.

29. An electron source as claimed in claim 28 wherein each of the plurality of field compensating electrodes is coupled to have a fifth potential applied thereto when an control electrode associated therewith is in the ENABLED condition and a sixth potential applied thereto when the control electrode associated therewith is in the DISABLED condition.

30. An electron source as claimed in claim 28 including in addition a surrounding electrode mounted in the second plane and having portions extending between adjacent field compensating electrodes.

31. An electron source as claimed in claim 27 wherein a dummy control electrode is positioned at each end of the plurality of control electrodes.

32. An electron source as claimed in claim 31 wherein the dummy control electrodes are coupled to have the second potential applied thereto.

33. An electron source as claimed in claim 31 including in addition a surrounding electrode mounted in the second plane and having portions extending between adjacent control electrodes.

34. An electron source as claimed in claim 33 wherein the surrounding electrode is coupled to have the first potential applied thereto.

* * * * *